(12) United States Patent
Vrijheid

(10) Patent No.: US 6,218,836 B1
(45) Date of Patent: Apr. 17, 2001

(54) MRI APPARATUS WITH A FEEDTHROUGH UNIT PROVIDED IN THE WALL OF A FARADAY CAGE

(75) Inventor: Johan E. W. Vrijheid, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/217,432

(22) Filed: Dec. 21, 1998

(30) Foreign Application Priority Data

Dec. 22, 1997 (EP) .................................................. 97204063

(51) Int. Cl.$^7$ ....................................................... G01V 3/00
(52) U.S. Cl. ............................................................... 324/318
(58) Field of Search .................................. 324/318, 309, 324/322

(56) References Cited

U.S. PATENT DOCUMENTS

| 4,374,369 | 2/1983 | Sakamoto et al. | .................... 333/182 |
| 5,573,000 | * 11/1996 | Goffer et al. | ......................... 324/318 |

FOREIGN PATENT DOCUMENTS 2184293   6/1987   (GB) .

* cited by examiner

Primary Examiner—Christine Oda
Assistant Examiner—Dixomara Vargas
(74) Attorney, Agent, or Firm—John F. Vodopia

(57) ABSTRACT

MRI apparatus include coil systems for generating magnetic fields. These coil systems require currents of some hundreds of A and voltages as high as some kV. Furthermore, weak and noise-sensitive signals must be detected in such apparatus; therefore, the measuring space of the apparatus is accommodated in a Faraday cage, but another part of the equipment of the MRI apparatus is arranged outside said cage. Therefore, power signals as well as data signals must be fed through II filters in the wall of the Faraday cage; thus far, such feeding through took place via one type of filter. In accordance with the invention, two filter elements are used, i.e. one filter element for the power conductors which comprises only one filter and one filter element for the data conductors which comprises several filters. The latter filter element is preferably provided with capacitors which are integrated in the connectors which are mounted on a PC board.

9 Claims, 4 Drawing Sheets

MRI APPARATUS WITH A FEEDTHROUGH UNIT PROVIDED IN THE WALL OF A FARADAY CAGE

BACKGROUND OF THE INVENTION

1. Field of the Invention

The invention relates to a magnetic resonance imaging apparatus which includes generating means for generating electromagnetic fields which are required so as to form MR images, transmission means for transmitting data signals, a first part of said means being accommodated in a Faraday cage whereas another part is accommodated outside the Faraday cage, said first and second parts being interconnected via connection leads which are fed through a wall of the Faraday cage by means of a feedthrough device which includes feedthrough filters.

2. Description of Related Art

A feedthrough device for feeding connection leads through a wall of a Faraday cage by means of feedthrough filters is known from the published UK patent application No. GB 2 184 293.

Generally speaking, a magnetic resonance imaging apparatus includes a coil system for generating a steady magnetic field in a measuring space of the apparatus, a gradient coil system for generating a magnetic gradient field in said measuring space, and RF coils for generating an RF magnetic alternating field. Because some of these coil systems (notably the gradient coil system) involve comparatively large currents (of the order of magnitude of some hundreds of A) and high voltages (of the order of magnitude of from several hundreds of V to kV) and because, moreover, very weak and noise-sensitive signals must be detected in such an apparatus, the measuring space of the apparatus and the associated coils are accommodated in a Faraday cage in order to shield external interference fields and to counteract the emergence of electromagnetic fields generated by the MRI apparatus itself. A part of the equipment of the MRI apparatus, however, is accommodated outside the Faraday cage. This holds for example, for the amplifiers for controlling the gradient coil system, for the data processing computer which serves to reconstruct the desired image from the measuring data obtained, for the control computer which serves to control the transport of the control signals required for generating the various measuring data, and for various power supply units which serve to supply the equipment inside the Faraday cage with energy.

In order to establish the necessary connections between the equipment inside the Faraday cage and that outside this cage there may be provided a feedthrough device which is arranged in the wall of the Faraday cage and is provided with feedthrough filters. Depending on the nature of the connection to be fed through, these feedthrough filters may take various forms.

For example, a glass fiber which is electrically insulating per se may be fed through a conductive tube having a length-to-width ratio which is larger than four. The attenuation (measured in dB) of such a tube amounts to 32 times the length-to-width ratio. When the appropriate length is chosen, adequate attenuation of external interference signals is then achieved in such a tube.

In order to prevent electrically conductive leads from transporting the interference signals generated outside the Faraday cage to the equipment arranged within the Faraday cage, the feedthrough device should satisfy a variety of requirements in respect of electromagnetic shielding. A conductor for transporting RF signals, for example should be constructed as a coaxial conductor provided with an electromagnetically suitably sealed cladding. This is achieved by constructing the cladding as a mechanically suitably tight tube; this coaxial conductor then becomes rigid and hence difficult to handle.

For the connection leads for the transmission of data signals (which need not transmit signals with a frequency content above 100 kHz), the requirement is imposed that the feedthrough filters must be low-pass filters and at 10 MHz an attenuation of 100 dB is required, corresponding to 18 dB per octave. Usually a so-called H filter is used for this purpose, i.e. a low-pass filter which consists of a first capacitor connected parallel to the input of the filter, a self-inductance between an input conductor and an output conductor, and a second capacitor connected parallel to the output of the filter.

The cited patent application GB 2 184 293 discloses a feedthrough device in which a number of connection leads is fed through a wall of the Faraday cage by means of a feedthrough device provided with feedthrough filters. The feedthrough filters described therein are filter elements, each of which includes one Π filter, so that these filters offer a suitable attenuation for comparatively high frequencies. However, if these filters were constructed for use in an MRI apparatus, they would have to conduct very large currents (of the order of magnitude of some hundreds of A) so that they would be very voluminous and expensive. The volume of these filters would be increased further due to said required attenuation of 18 dB/octave at high frequencies, so that they would have to be constructed so as to be rotationally symmetrical, which in its turn would lead to additional requirements as regards the construction and a further increase of the volume of the filters.

SUMMARY OF THE INVENTION

It is an object of the invention to provide a magnetic resonance imaging apparatus of the kind set forth in which the volume of the feedthrough device is substantially smaller than the volume of the known feedthrough device so that its manufacture is less expensive.

To this end, the magnetic resonance imaging apparatus according to the invention is characterized in that the feedthrough device is provided with first, separate filter elements, each of which includes only one feedthrough filter, each time only one of said feedthrough filters being arranged in a connection lead of the generating means, and that the feedthrough device is also provided with at least one second, separate filter element which includes a plurality of feedthrough filters, each time only one of the latter feedthrough filters being arranged in a connection lead of the transmission means for transmitting data signals. In respect of feedthrough filtering these steps separate the connection leads intended to carry comparatively large currents and/or voltages from the connection leads which are intended to transmit currents and/or voltages of a comparatively low level. Examples of such currents and voltages of comparatively low level are currents amounting to less than approximately 100 mA and voltages amounting to less than approximately 15 V. The latter feedthrough filters can thus be constructed so as to be comparatively small and can be economically combined so as to form a filter element which includes a plurality of filters, each of which is associated with a respective connection lead.

The second separate filter element in an embodiment of the magnetic resonance imaging apparatus according to the invention is provided with input connectors which are constructed as a component having a plurality of connection conductors, and with output connectors which are constructed as a component having a plurality of connection conductors, the feedthrough filters of the relevant filter element being arranged between the connection conductors of the input connectors and the output connectors. The filters can thus be readily and economically assembled.

The feedthrough filters of the second separate filter element in the magnetic resonance imaging apparatus are constructed in a preferred embodiment of the invention so as to include an input capacitor and an output capacitor, said input capacitors being integrated in the input connector which is constructed as a component, said output capacitors being integrated in the output connector which is constructed as a component, the arrangement being such that the input capacitors and the output capacitors are assigned to the connection conductors of the connectors in a one by one fashion. This step enables the use of commercially available connectors provided with capacitors, so that the costs of mounting are substantially reduced.

In a further embodiment of the invention, the connection conductors of the connectors in the magnetic resonance imaging apparatus are constructed as strip-shaped flat pins, and the input capacitors and the output capacitors are constructed as chip capacitors. It would be feasible to construct the feedthrough filters for the low currents and voltages as a filter which has dimensions adapted to the low currents and voltages and is constructed by means of discrete components. However, problems may arise in such feedthrough filters because due to the skin effect the RF energy is insufficiently dissipated via the capacitors; there is a risk that the desired filter attenuation is not ensured in adverse conditions. The steps according to the invention provide large contact surfaces between the connection pins and the capacitors so that adequate dissipation of RF energy is achieved.

In a further embodiment of the invention, the second separate filter element in the magnetic resonance imaging apparatus is provided with a printed circuit board and the connectors which are constructed as a component are mounted on the printed circuit board. Furthermore, the feedthrough filters of the second separate filter element may be provided with a self-inductance element which is arranged between an associated input capacitor and an associated output capacitor on the printed circuit board and is connected to the associated capacitors via conductor tracks on the printed circuit board. The mounting of the second filter element can thus be further simplified.

In a further embodiment of the invention, the connectors in the magnetic resonance imaging apparatus which are constructed as components are formed as a D-sub-connector. A further, economical standard construction of the second filter element is thus achieved.

BRIEF DESCRIPTION OF THE DRAWING

The invention will be described in detail hereinafter with reference to the Figures in which corresponding reference numerals denote corresponding elements. Therein.

DETAILED DESCRIPTION OF THE PREFERRED EMBODIMENT

Figure 1:
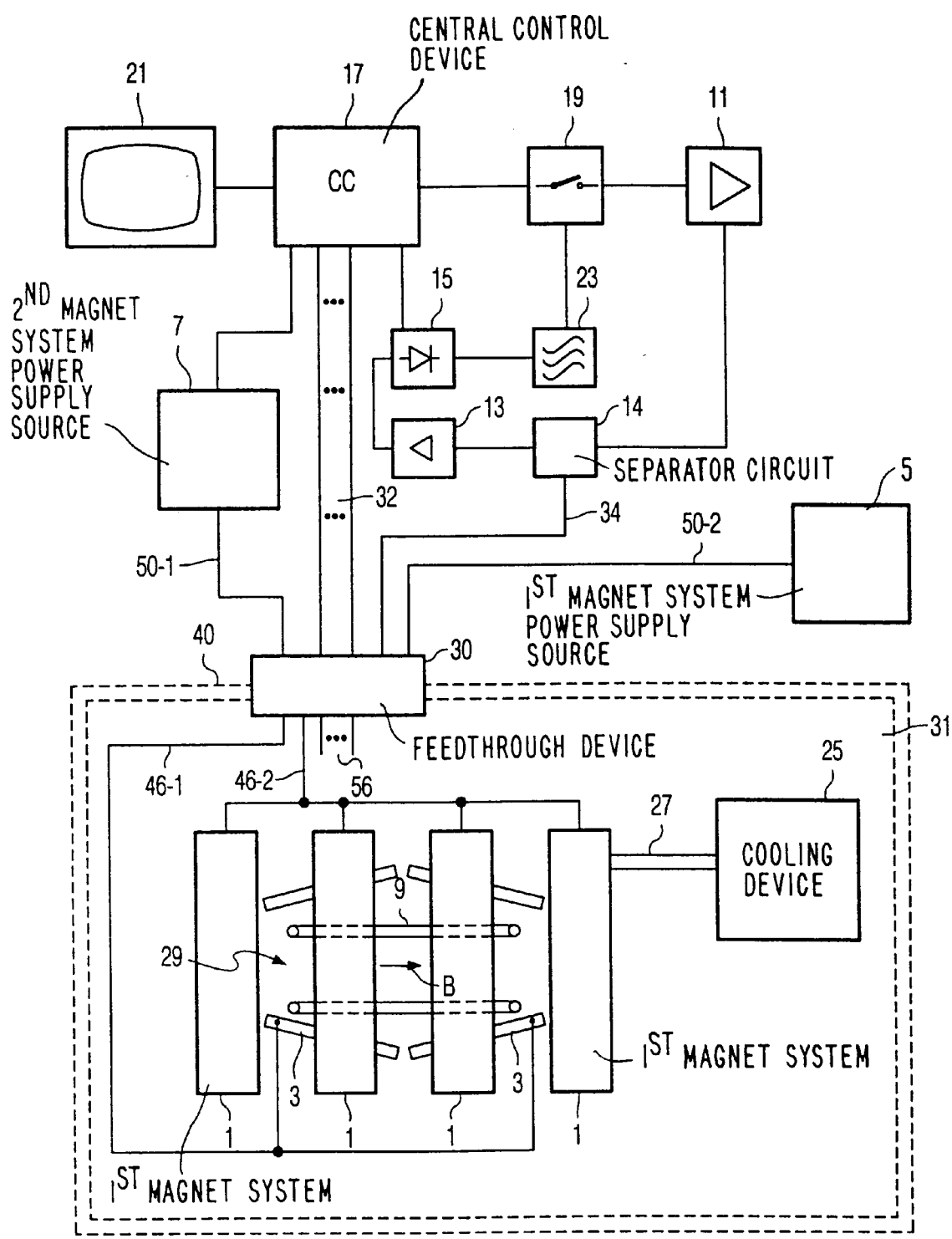
FIG. 1 shows diagrammatically the general construction of a magnetic resonance imaging apparatus in which the invention can be used.

The magnetic resonance imaging apparatus which is diagrammatically shown in FIG. 1 includes a first magnet system 1 for generating a steady magnetic field B, a second magnet system 3 for generating magnetic gradient fields, a power supply source 5 for the first magnet system 1, and a power supply source 7 for the second magnet system 3. An RF coil 9 serves to generate an RF magnetic alternating field; to this end, it is connected to an RF transmitter device which includes an RF source 11. The RF coil 9 may also be used to detect spin resonance signals generated in an object to be examined (not shown) by the RF transmitter field; to this end, the RF coil is connected to an RF receiving device which includes a signal amplifier 13. The output of the signal amplifier 13 is connected to a detector circuit 15 which is connected to a central control device 17. The central control device 17 also controls a modulator 19 for the RF source 11, the power supply source 7 and a monitor 21 for display. An RF oscillator 23 controls the modulator 19 as well as the detector 15 which processes measuring signals. The forward and return RF signal traffic is separated from one another by a separator circuit 14. A cooling device 25, which includes cooling ducts 27, serves to cool the magnet coils of the first magnet system 1. The RF coil 9, being arranged within the magnet systems 1 and 3, encloses a measuring space 29 which is large enough to accommodate a patient to be examined, or a part of a patient to be examined, for example the head and the neck, in an apparatus for medical diagnostic measurements. Thus, a steady magnetic field B, gradient fields for selecting object slices, and a spatially uniform RF alternating field can be generated in the measuring space 29. The RF coil 9 can combine the functions of transmitter coil and measuring coil. Alternatively, separate coils can be used for the two functions, for example surface coils as measuring coils. The assembly formed by the coil system 1, the coil 9 and the second magnet system (gradient coils) 3 is enclosed by an RF field shielding Faraday cage 31.

A supply lead 50-1 extends from the power supply source 7 to the feedthrough device 30; furthermore, a supply lead 50-2 extends from the power supply source 5 to the feedthrough device 30. The central control device 17 and the various parts of the MRI apparatus which are to be controlled and are arranged within the Faraday cage 31 (not shown) are interconnected by means of connection leads 32 which are connected to the relevant parts to be controlled via the feedthrough device 30. Furthermore, an RF connection lead 34 is provided between the separator circuit 14 and the feedthrough device. Inside the Faraday cage the supply lead 50-1 continues as a connection lead 46-1 and the supply lead 50-2 continues as a connection lead 46-2. The bundle of connection leads 32 continues as a bundle of connection leads 56 within the Faraday cage.

Figure 2:
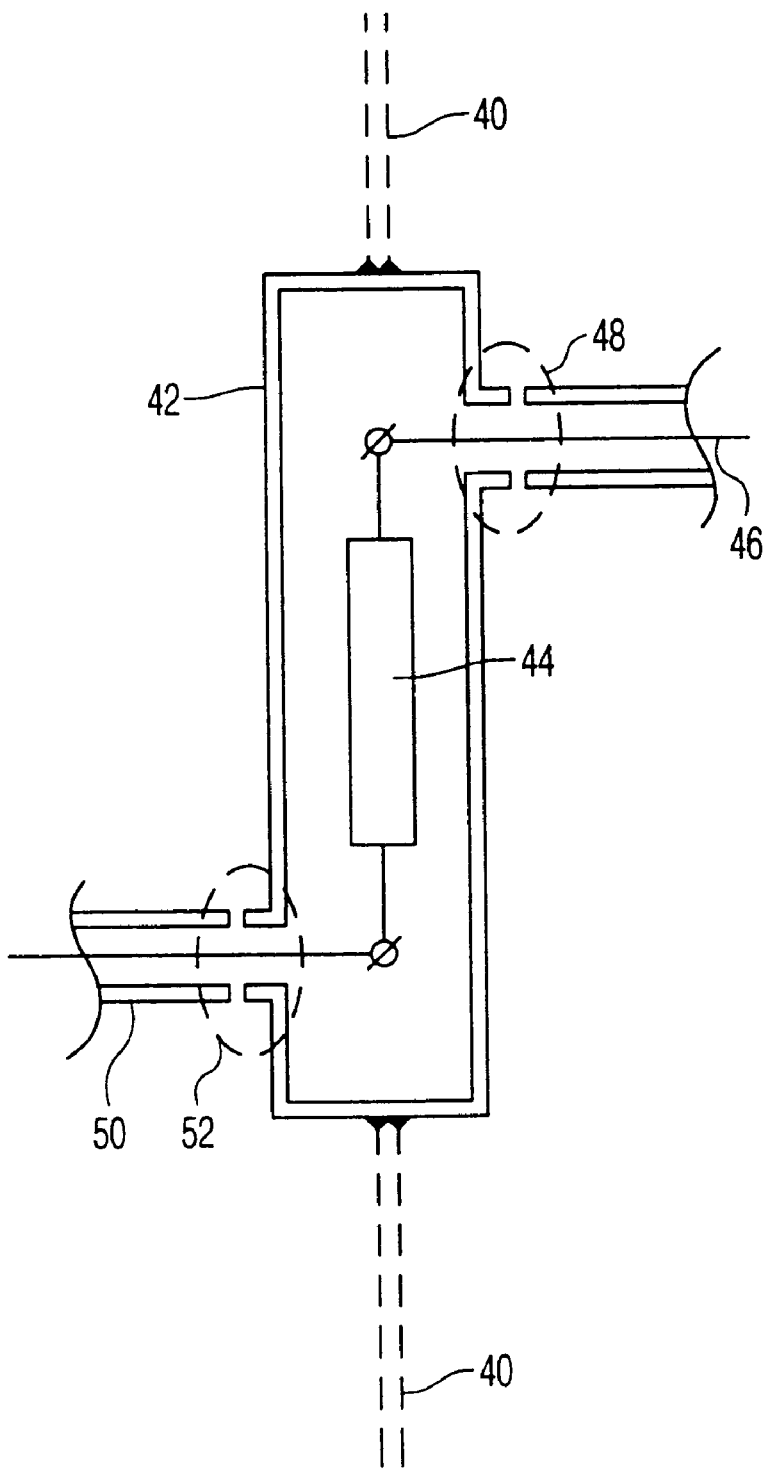
FIG. 2 shows diagrammatically a state-of-the-art feedthrough device for use in an MRI apparatus.

FIG. 2 shows a prior art feedthrough device for use in an MRI apparatus as described with reference to FIG. 1. The feedthrough device shown is mounted in the wall 40 of the Faraday cage 31 in which the MRI apparatus is arranged. The feedthrough device includes a housing 42 which shields RF signals and accommodates a number (typically approximately 70) of mutually identical feedthrough filters 44. The filters have cylindrical shape with a diameter of approximately 4 cm and a height of approximately 20 cm. The connection leads 46 extending from the feedthrough device to the MRI apparatus are coupled to the housing 42 via a (diagrammatically shown) connector 48 which is constructed, for example as a coaxial connector. The connection leads 50 extending from the feedthrough device to the part of the equipment which is accommodated outside the Faraday cage are coupled to the housing 42 via a (diagrammatically shown) connector 52 which may also be constructed as a coaxial connector. The above-mentioned feedthrough filters are proportioned so as to carry currents of the order of some hundreds of A and voltages of the order of kV, so that these feedthrough filters are voluminous and expensive.

Figure 3:
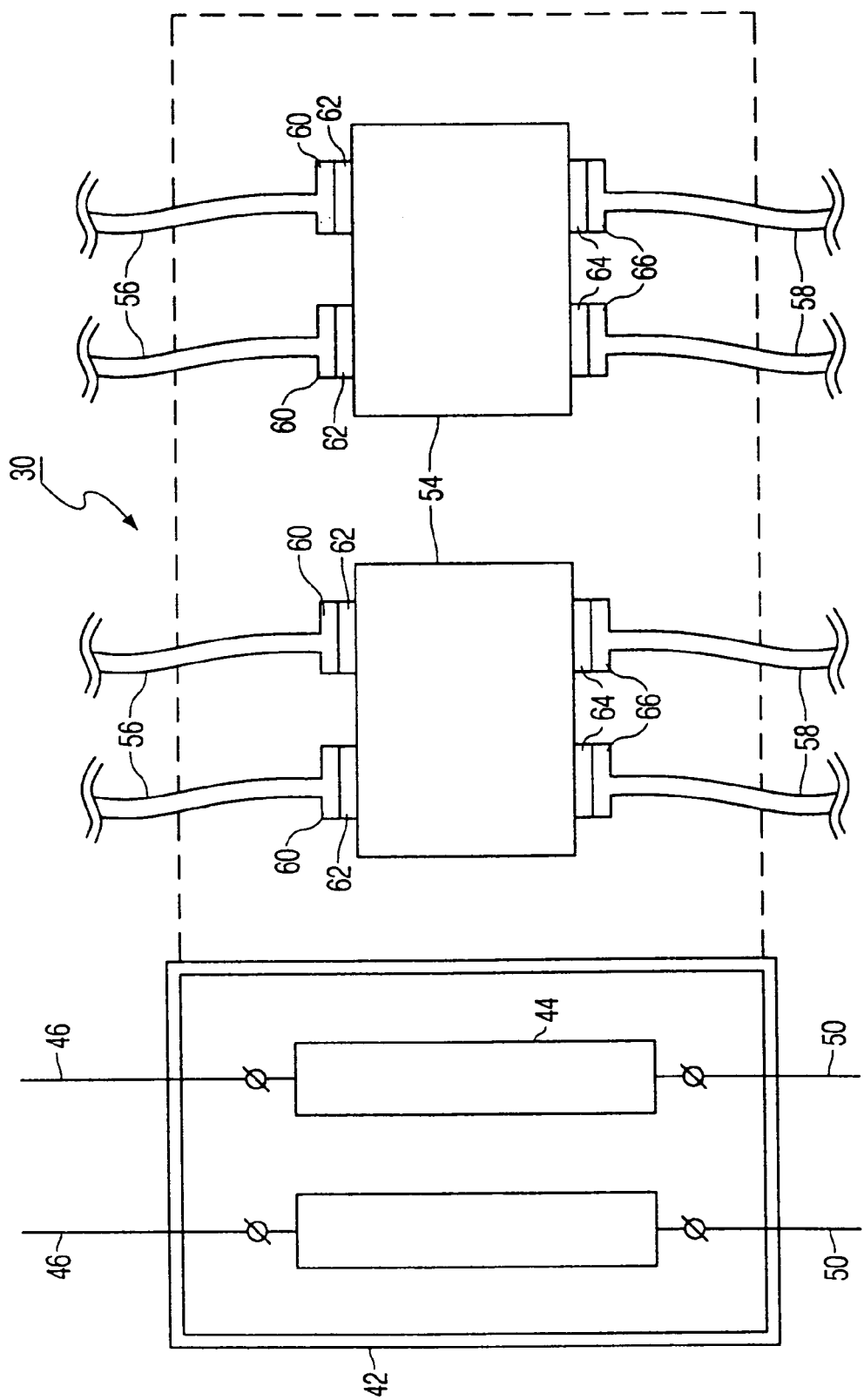
FIG. 3 shows diagrammatically a feedthrough device according to the invention.

FIG. 3 shows a feedthrough device according to the invention including connection leads 50 which run into the cage and connection leads 46 which extend from the cage. This feedthrough device includes a number of separate filter elements 44, each of which consists of only one feedthrough filter, and a number of separate filter elements 54, each of which includes several feedthrough filters. Even though only two of each of the filter elements 44 and 54 are shown, it is to be understood that any arbitrary number of such filter elements may form part of the feedthrough device according to the invention. Like in FIG. 2, the filter element 44 is accommodated in a shielding housing 42. The filter elements 54 may also be accommodated in this shielding housing, but it is alternatively possible to provide each of these elements with a respective shielding housing (so-called "EMC-tight" housing). Each of the filter elements 54 is provided with one or more input connectors 62 which co-operate with connectors 60 which are to be coupled thereto and are connected to the connection lines 56 which extend from the feedthrough device to the part of the equipment which is accommodated outside the Faraday cage. Furthermore, each of the filter elements 54 is provided with one or more output connectors 64 which co-operate with the connectors 66 which are to be coupled thereto and are connected to the connection lines 58 which extend from the feedthrough device to the part of the equipment which is accommodated in the Faraday cage.

Figure 4:
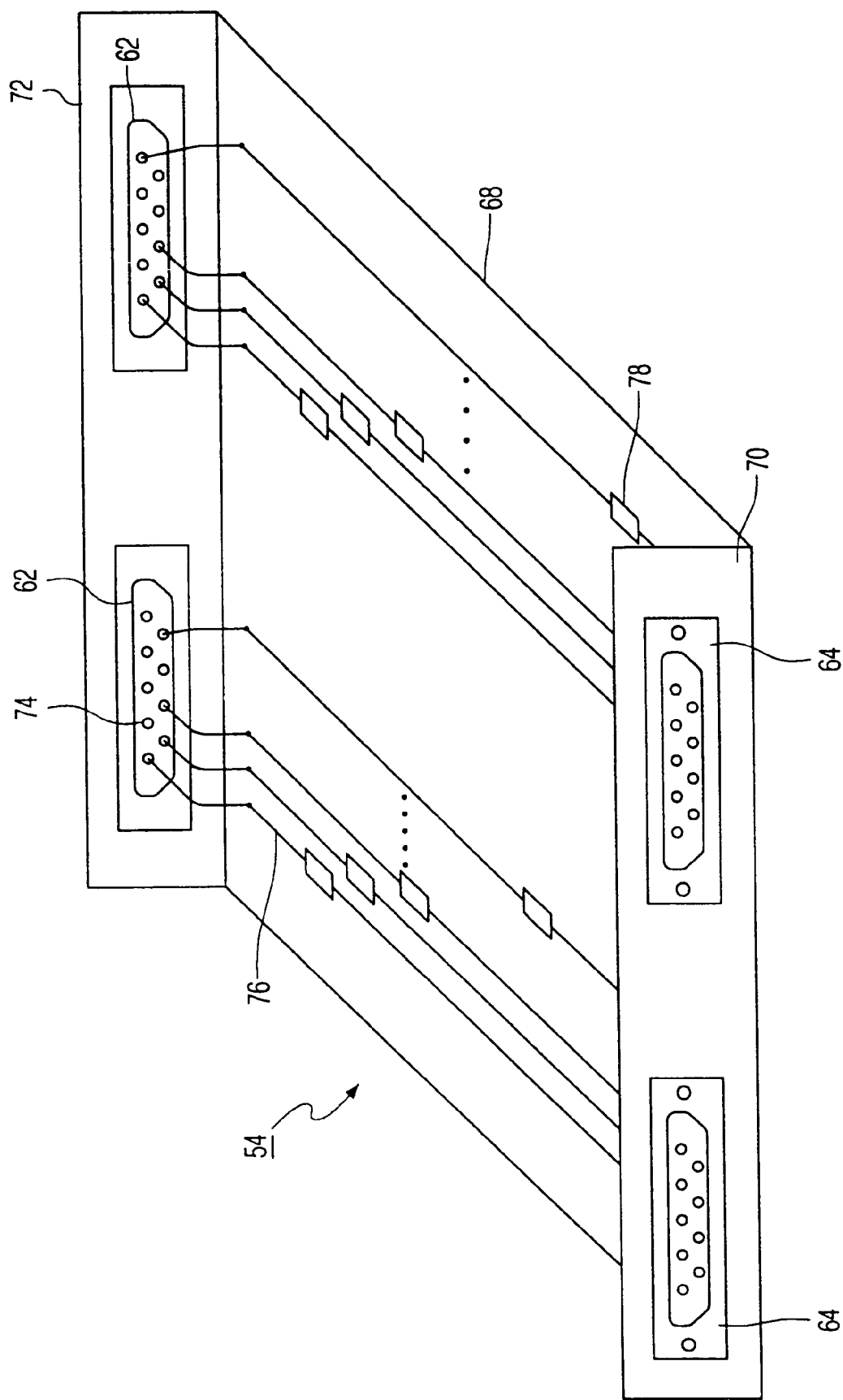
FIG. 4 shows diagrammatically a separate filter element in the form of a PC board with connectors, which element includes a plurality of feedthrough filters according to the invention.

FIG. 4 shows a separate filter element in the form of a PC board provided with connectors, said filter element including a plurality of feedthrough filters in accordance with the invention.

Even though FIG. 4 shows only the construction of the separate filter element, it is to be understood that it is also possible to construct this filter element so as to have an own EMC-tight housing. At the edges of a PC board 68 there are provided two upright edges 70 and 72 in which the input connectors 62 and the output connectors 64 are mounted. These connectors are commercially available connectors of the D-sub type, for example the type FCC 17 marketed by Amphenol Canada Corp. These connectors are constructed so as to include built-in chip capacitors and connection conductors in the form of strip-shaped flat pins. The pins 74 of the connectors are connected to the conductor tracks 76 which are provided on the PC board 68 and each of which includes a respective self-inductance element 78 which is constructed so that it is suitable for mounting on a PC board. In order to limit any crosstalk between these elements, they are mounted so as to be offset relative to one another so that they are not mounted directly adjacent one another on the PC board. Typical values for the various components are: 47 nF for the capacitors and 1 $\mu$H for the self-inductance elements. Using these elements, a filter element for 36 feedthrough filters can be constructed so as to be dimensioned 10 cm×20 cm. During a simulation of such a filter element, an attenuation of more than 100 dB was measured at a frequency of 10 MHz, demonstrating that the filter element thus constructed satisfies the attenuation requirements imposed.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A magnetic resonance imaging apparatus comprising:
   generating means for generating electromagnetic fields which are required to form MR images,
   transmission means for transmitting data signals, wherein a first part of said generating means and said transmission means is accommodated in a Faraday cage whereas a second part is accommodated outside the Faraday cage,
   said first and second parts being interconnected via connection leads which are fed through a wall of the Faraday cage by means of a feedthrough device which includes feedthrough filters, and wherein
   the feedthrough device is provided with first, separate filter elements, each of which includes only one feedthrough filter, each of said one feedthrough filters being arranged in a connection lead of the generating means, and the feedthrough device is also provided with at least one second, separate filter element which includes a plurality of feedthrough filters constructed to provide EMI protection, each of the plurality of feedthrough filters of the second separate filter element being arranged in a connection lead of the transmission means for transmitting data signals.

2. A magnetic resonance imaging apparatus as claimed in claim 1, wherein the second separate filter element is provided with input connectors which are constructed as a component having a plurality of connection conductors, and with output connectors which are constructed as components having a plurality of connection conductors, the feedthrough filters of the relevant filter element being arranged between the connection conductors of the input connectors and the output connectors.

3. A magnetic resonance imaging apparatus as claimed in claim 2, wherein each feedthrough filter of the second separate filter element comprises an input capacitor and an output capacitor, each said input capacitor being integrated in the input connector which is constructed as a component, each said output capacitor being integrated in the output connector which is constructed as a component, the arrangement being such that the input capacitors and the output capacitors are assigned to the connection conductors of the connectors in a one by one fashion.

4. A magnetic resonance imaging apparatus as claimed in claim 3, wherein the connection conductors of the connectors comprise strip-shaped flat pins, and the input capacitors and the output capacitors are chip capacitors.

5. A magnetic resonance apparatus as claimed in claim 4, wherein the second separate filter element comprises a printed circuit board and the connectors which are constructed as a component are mounted on the printed circuit board.

6. A magnetic resonance imaging apparatus as claimed in claim 5, wherein each feedthrough filter of the second separate filter element comprises a self-inductance element which is arranged between an associated input capacitor and an associated output capacitor on the printed circuit board and is connected to the associated capacitors via conductor tracks on the printed circuit board.

7. A magnetic resonance imaging apparatus as claimed in claim 6, wherein the connectors which are constructed as a component are of the D-sub type.

8. A feedthrough device for feeding connection leads through a wall of a Faraday cage of a magnetic resonance apparatus comprising:
- first, separate filter elements mounted on a printed circuit board, each of which includes only one feedthrough filter, each of said feedthrough filters being arranged in a connection lead, and
- at least one second, separate filter element which includes a plurality of feedthrough filters constructed to provide EMI protection, each of the latter feedthrough filters being arranged in a connection lead.

9. A filter element for use in a feedthrough device as claimed in claim 8 comprising a printed circuit board on which there are mounted:
- input connectors and output connectors which are D-sub-connectors and each of which is provided with capacitors integrated in the connector, and
- a self-inductance element which is arranged between an associated input capacitor and an associated output capacitor on the printed circuit board and is connected to the associated capacitors via conductor tracks on the printed circuit board.

* * * * *